(12) United States Patent
Haight

(10) Patent No.: US 7,444,565 B1
(45) Date of Patent: Oct. 28, 2008

(54) RE-PROGRAMMABLE COMSEC MODULE

(75) Inventor: Charles Francis Haight, Pine Brook, NJ (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 539 days.

(21) Appl. No.: 10/994,476

(22) Filed: Nov. 23, 2004

Related U.S. Application Data

(60) Provisional application No. 60/524,033, filed on Nov. 24, 2003.

(51) Int. Cl.
*G01R 31/28* (2006.01)

(52) U.S. Cl. .................. 714/725; 713/193; 713/500; 713/400; 713/401; 714/733; 714/735; 714/48; 714/738; 714/799; 714/736; 714/742; 714/811; 714/815; 714/797

(58) Field of Classification Search ............... None
See application file for complete search history.

(56) References Cited

U.S. PATENT DOCUMENTS

| | | | | |
|---|---|---|---|---|
| 5,913,020 | A * | 6/1999 | Rohwer | 714/8 |
| 6,104,211 | A * | 8/2000 | Alfke | 326/91 |
| 6,297,665 | B1 * | 10/2001 | Bauer et al. | 326/40 |
| 6,347,387 | B1 * | 2/2002 | Fischer | 714/738 |
| 6,526,559 | B2 * | 2/2003 | Schiefele et al. | 716/16 |
| 6,611,935 | B1 * | 8/2003 | Landry | 714/736 |
| 6,704,889 | B2 * | 3/2004 | Veenstra et al. | 714/39 |
| 6,772,381 | B1 * | 8/2004 | Somchit et al. | 714/725 |
| 6,838,899 | B2 * | 1/2005 | Plants | 326/9 |
| 6,874,108 | B1 * | 3/2005 | Abramovici et al. | 714/725 |
| 6,966,020 | B1 * | 11/2005 | Abramovici et al. | 714/725 |
| 7,036,059 | B1 * | 4/2006 | Carmichael et al. | 714/725 |
| 7,080,300 | B1 * | 7/2006 | Herron et al. | 714/726 |
| 7,112,992 | B1 * | 9/2006 | Guzman et al. | 326/38 |
| 7,127,616 | B2 * | 10/2006 | Kaneko | 713/191 |
| 7,191,342 | B1 * | 3/2007 | New et al. | 713/190 |
| 2003/0135802 | A1 * | 7/2003 | Klein et al. | 714/725 |
| 2003/0212940 | A1 * | 11/2003 | Wong | 714/725 |
| 2004/0088538 | A1 * | 5/2004 | Isip et al. | 713/153 |
| 2004/0124876 | A1 * | 7/2004 | Plants | 326/39 |

* cited by examiner

*Primary Examiner*—Jacques Louis-Jacques
*Assistant Examiner*—Guerrier Merant
(74) *Attorney, Agent, or Firm*—Edell, Shapiro & Finnan, LLC

(57) ABSTRACT

A method of mitigating logic upsets includes providing an input to each of a plurality of programmable logic components, processing the input in each programmable logic component, determining an output from each programmable logic component, providing the output from each programmable logic component to a fixed logic component, examining the outputs, and determining a validated output from among the outputs. An architecture for mitigating logic upsets includes an input, a plurality of programmable logic components, and a fixed logic component. The input is provided to each of the programmable logic components. Each programmable logic components includes an encryption algorithm and a first majority voting logic, and processes the respective input to determine a respective output. The fixed logic component includes a second majority voting logic. The fixed logic component receives each respective output from the programmable logic components, examines the outputs, and determines a validated output.

36 Claims, 2 Drawing Sheets

RE-PROGRAMMABLE COMSEC MODULE

CROSS-REFERENCE TO RELATED APPLICATION

This application claims priority under 35 USC §120 to Provisional Application No. 60/524,033, filed on Nov. 24, 2003, and titled "A Re-programmable COMSEC Module," the entire contents of which are hereby incorporated by reference.

FIELD OF THE INVENTION

This invention relates to a programmable logic, and more particularly, to an architecture for a reprogrammable COMSEC module that can be used in space applications.

BACKGROUND

In the space environment, handling secure communications presents unique complications. For example, large temperature gradients occur within the electronics that must be tolerated. Specifically, two different sides of a component can be at opposite temperature extremes, e.g., the side facing the sun is hot and the side facing away from the sun is cold. Free-floating radiation, e.g., photons and neutrons, can penetrate an electronic device and cause the electronics to malfunction, e.g., flip a bit: 1 to 0 or 0 to 1, which could corrupt data communications or cause an erroneous result to be output.

Additionally, the component architecture must usually consider communications security (COMSEC) requirements to protect sensitive information and significant governmental interests. Currently, government satellite information is required to be secured with Type 1 encryption and current modules are classified and thus, impose significant hardships (i.e., costs, time, security measures, inventory controls) on satellite vendors.

There are generally two approaches to countering or mitigating the potential for error in a system: redundancy and independence. With redundancy, multiple copies of the same component perform the same functions, usually in lock-step, and each component obtains a result. The results are usually the same, and therefore, considered the correct result. There is, however, an inherent flaw in the redundancy approach when the result reached by each component is incorrect. Because of the redundancy in the components, the components make the same error and thus, determine the same incorrect result. For example, the components may be affected by free-floating radiation in space. Even with redundancy, i.e., multiple copies of the same component performing the same functions, the result may be incorrect because each of the components were affected by the radiation and thus made the same error.

With independence, multiple components reach the result without an exchange of information between/among themselves. The components could be multiple copies of the same component or different components performing the same calculations. In either instance, if the components reach the same result, then presumably the result is a correct result because none of the components communicated with each other and thus did not influence any other result. However, the inherent flaw in the independent approach arises when different results are provided and there is no indication which of the possible results is correct. Thus, with the current architecture, errors may occur unnoticed or, if an error is noted, the error may not be correctable.

One known method for countering errors caused by penetration of free-floating radiation is triple mode redundancy (TMR). TMR is a technique by which three implementations of the same function and their results are voted using a voting circuit to determine an output. Using TMR, an electronic component can, at times, continue to operate in spite of an error. A TMR implementation may be a register technique where each register is implemented by three flip-flops (or latches) that "vote" to determine the state of the register. Alternatively, combinatorial cells could be used instead of flip-flops or latches. However, there are still flaws with such a mitigation technique, particularly, if one of the registers becomes temporarily or permanently non-operable. The TMR mitigation technique becomes insufficient because only two of the three registers are operable.

Further, current architecture is generally not able to correct for errors during operation because the electronic components have fixed programming as a consequence of an effort to "harden" components against radiation influences. The term "hardened" (or "hard") refers to forming the electronic component in such a way that the electronic is resistant to penetration by free-floating radiation, i.e., relatively unaffected by free-floating radiation.

The architecture of electronics in space, however, needs the ability to accommodate and correct for errors as they arise, e.g., by inactivating a component for reprogramming. For instance, after a space vehicle is in orbit, a need can arise that requires modification of the electronics. In order to provide such adaptability, the communications security (COMSEC) must be modifiable. Currently available space devices have limited, if any, flexibility because fixed cryptographic algorithms are used and there are a fixed number of channels available.

Current architecture can be considered radiation resistant, i.e., able to withstand particle penetration, if designed as such. Such electronic components are, for example, SOS, silicon on sapphire, or SOI, silicon on insulator. While there is a benefit to being radiation resistant, the functions of such components are fixed. There is no flexibility to adapt the components, e.g., re-program the component, to changing missions needs, or even, correcting for internal errors.

Moreover, different electrical components within a device may function at different levels with regard to maintaining, sending and receiving non-critical and critical information. For non-critical information, it is possible to include bit error checking and even some bit error correcting, while a component is in use. However, with critical information, it is not possible for even one bit to be in error; the result is that the information is corrupted and not recoverable.

SUMMARY

Potential errors caused by free-floating radiation particles can be mitigated. In particular, triple mode redundancy (TMR) can be implemented in an electronic device where there are both programmable and fixed logic components. Each piece of programmable logic, e.g., field programmable gate arrays (FPGAs), implements TMR to provide a respective result to the fixed logic component, e.g., application specific integrated circuit (ASIC). The term, "fixed," means that the component is programmed, and that the component is not reprogrammable during operation. An example of a fixed logic component is an ASIC. The fixed logic component then implements TMR and examines the results, e.g., three results, and determines the correct result. The correct result is determined through majority voting, i.e., where there are three results, the correct result is the result that at least two of the programmable logic components provided to the fixed logic component.

The programmable logic components are radiation tolerant. The fixed logic component is "hardened," e.g., radiation resistant.

With a predetermined multi-tier architectural design that incorporates TMR at each tier, a mixture of radiation tolerant and radiation resistant (e.g., "hardened") electronic components can be used to accommodate and/or correct for potential errors resulting from penetration of free-floating radiation. Further, the flexibility to reprogram electronic component functions becomes possible with the use of radiation tolerant electronic components.

In a general aspect, a method of mitigating logic upsets includes providing an input to each of a plurality of programmable logic components, processing the input in each of the plurality of programmable logic components, determining an output from each of the plurality of programmable logic components, providing the output from each of the plurality of programmable logic components to a fixed logic component, examining the outputs from the plurality of programmable logic components, and determining a validated output from among the outputs from the plurality of programmable logic components.

Some or all of the following features may be included in the above method. The plurality of programmable logic components is N programmable logic components, where N is an integer number greater than 2. More particularly, N can equal 3. Alternately, N can equal 4.

The input includes N copies of the input and each of the N copies of the input is provided to each of the N programmable logic components, respectively. The input can be plaintext data.

Each of the programmable logic components can be a field programmable gate array (FPGA). Each of the programmable logic components can be radiation tolerant. Each of the plurality of programmable logic components can include an encryption algorithm and a majority voting logic. Each of the plurality of programmable logic components can process the input redundantly through the encryption algorithm to obtain redundant results. Each of the plurality of programmable logic components can process the redundant results through the majority voting logic to determine the output of each of the plurality of programmable logic components, respectively. The majority voting logic can be triple mode redundancy (TMR) logic.

The fixed logic component can be an application specific integrated circuit (ASIC). The fixed logic component can be radiation resistant.

Each of the plurality of programmable logic components can include the same encryption algorithm. Each of the plurality of programmable logic components can receive the same input.

The fixed logic component can include majority voting logic. The majority voting logic can be triple mode redundancy (TMR) logic. The fixed logic component can process the outputs of each of the plurality of programmable logic components to determine the validated output.

In another general aspect, an architecture for mitigating logic upsets includes an input, a plurality of programmable logic components, and a fixed logic component. The input is provided to each of the plurality of programmable logic components. Each of the programmable logic components includes an encryption algorithm and a first majority voting logic. Each of the plurality of programmable logic components processes the respective input to determine a respective output from each of the plurality of programmable logic components. The fixed logic component receives each respective output from each of the plurality of programmable logic components. The fixed logic component includes a second majority voting logic. The fixed logic component examines the outputs from the plurality of programmable logic components and determines a validated output.

Some or all of the following features may be included in the above implementation. The plurality of programmable logic components is N programmable logic components, where N is an integer number greater than 2. More particularly, N can equal 3. Alternately, N can equal 4.

The input includes N copies of the input and each of the N copies of the input is provided to each of the N programmable logic components, respectively. The input can be plaintext data.

Each of the plurality of programmable logic components can process the input redundantly through the encryption algorithm to obtain redundant results. Each of the plurality of programmable logic components can process the redundant results through the first majority voting logic to determine the output of each of the plurality of programmable logic components, respectively. The first majority voting logic can be triple mode redundancy (TMR) logic. Each of the plurality of programmable logic components can include the same encryption algorithm. Each of the plurality of programmable logic components can receive the same input.

Each of the programmable logic components can be a field programmable gate array (FPGA). Each of the programmable logic components can be radiation tolerant.

The fixed logic component can be an application specific integrated circuit (ASIC). The fixed logic component can be radiation resistant. The second majority voting logic can be triple mode redundancy (TMR) logic. The fixed logic component can process the outputs of each of the plurality of programmable logic components to determine the validated output.

The above and still further features will become apparent upon consideration of the detailed description of specific implementations thereof, when taken in conjunction with the accompanying drawings wherein like reference numerals in the various figures are used to designate like components.

BRIEF DESCRIPTION OF THE FIGURES

The invention will now be explained in more detail with reference to the accompanying figures.

DETAILED DESCRIPTION

The space environment is extremely harsh and electronic components are constantly bombarded with free-floating radiation, i.e., photons and neutrons. Consequently, electronic components, such as field programmable gate arrays (FPGAs), may "upset," e.g., make an error or malfunction, during operation. Upsets or errors caused by free-floating radiation particles can be mitigated. Portions of the architecture of the electronics can be "hardened" with regard to radiation penetration. The term "hardened" (or "hard") refers to forming the electronic in such a way that the electronic is resistant to penetration by free-floating radiation. By "hardening" an electronic component or an electronic device, the component/device is better able to be unaffected by free-floating radiation and perhaps errors typically caused by penetration of free-floating radiation can be prevented. In particular, to mitigate FPGA upsets, an overall device architecture can be designed so as to mix "hard" electronic parts, e.g., application specific integrated circuits (ASICs), with electronic parts that are radiation tolerant (e.g., FPGAs).

Cryptographic flexibility can be accomplished by allowing modifications to the COMSEC module after launch. In particular, the programmable logic components, e.g., the FPGAs, can be re-programmed after launch. For example, a software upgrade to the space vehicle electronics could implement high-speed en/decryption along with parallel interfaces to support a high-speed design, which could send space images to the ground.

Consequently, it is possible that the programmable logic component(s) could be unclassified until programmed. By having a COMSEC module that is unclassified until programmed, vendors would more easily be able to pursue commercial use of such modules and would minimize possible financial and other hardships to the vendor, such as inventory tracking, security monitoring, and security clearances. It also avails other than Type I implementations to satellite vendors. Many vendors may want to protect their proprietary data using other algorithms. The invention is not restricted to just Type I implementations and can be used with algorithms such as AES (Advanced Encryption Standard). This invention would avail to these implementation the same data accuracy and the same reprogrammability features.

Figure 1:
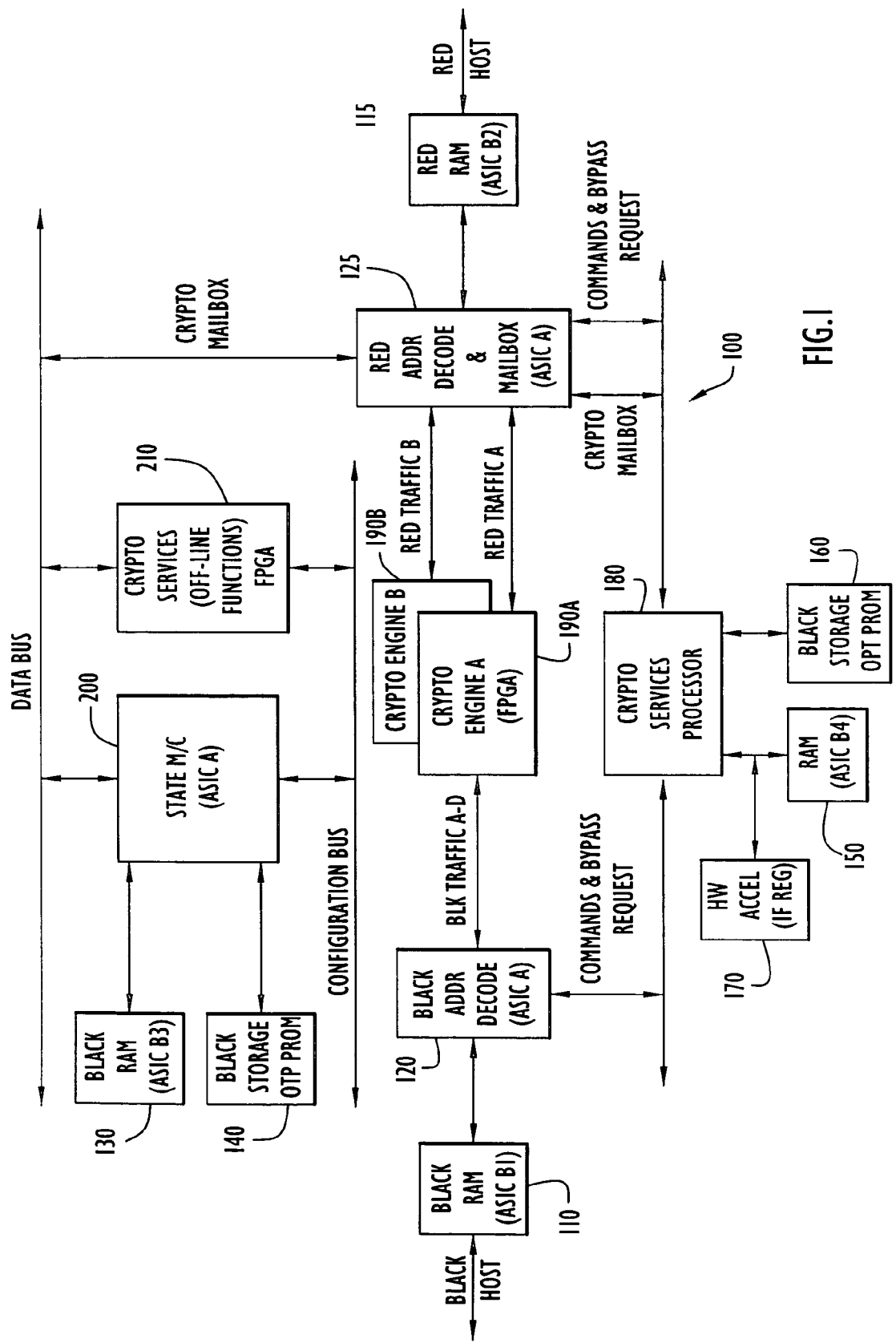
FIG. 1 illustrates the current architecture of a known COMSEC module.

Referring to FIG. 1, an exemplary architecture for a COMSEC module used in space includes a processor 180, memory 110, 115, 130, 150, storage 140, 160, fixed programmed components 120, 125, 200, and programmable components 190A, 190B, 210. As appropriate, the components are also designated "red" or "black." The term "red" means that the incoming or outgoing communication is plaintext, unprotected, and unencrypted. The term "black" means that the incoming or outgoing communication is ciphertext, protected, and encrypted.

Accordingly, the COMSEC module includes the security-critical functions: red/black separation, encrypt/decrypt, fill interface, and key management. Both hardware and software are used to implement the security-critical functions. The cryptographic engines 190A, 190B are implemented with FPGA technology that has been "hardened" for space applications. For example, cryptographic engine A is an FPGA that is radiation tolerant.

Figure 2:
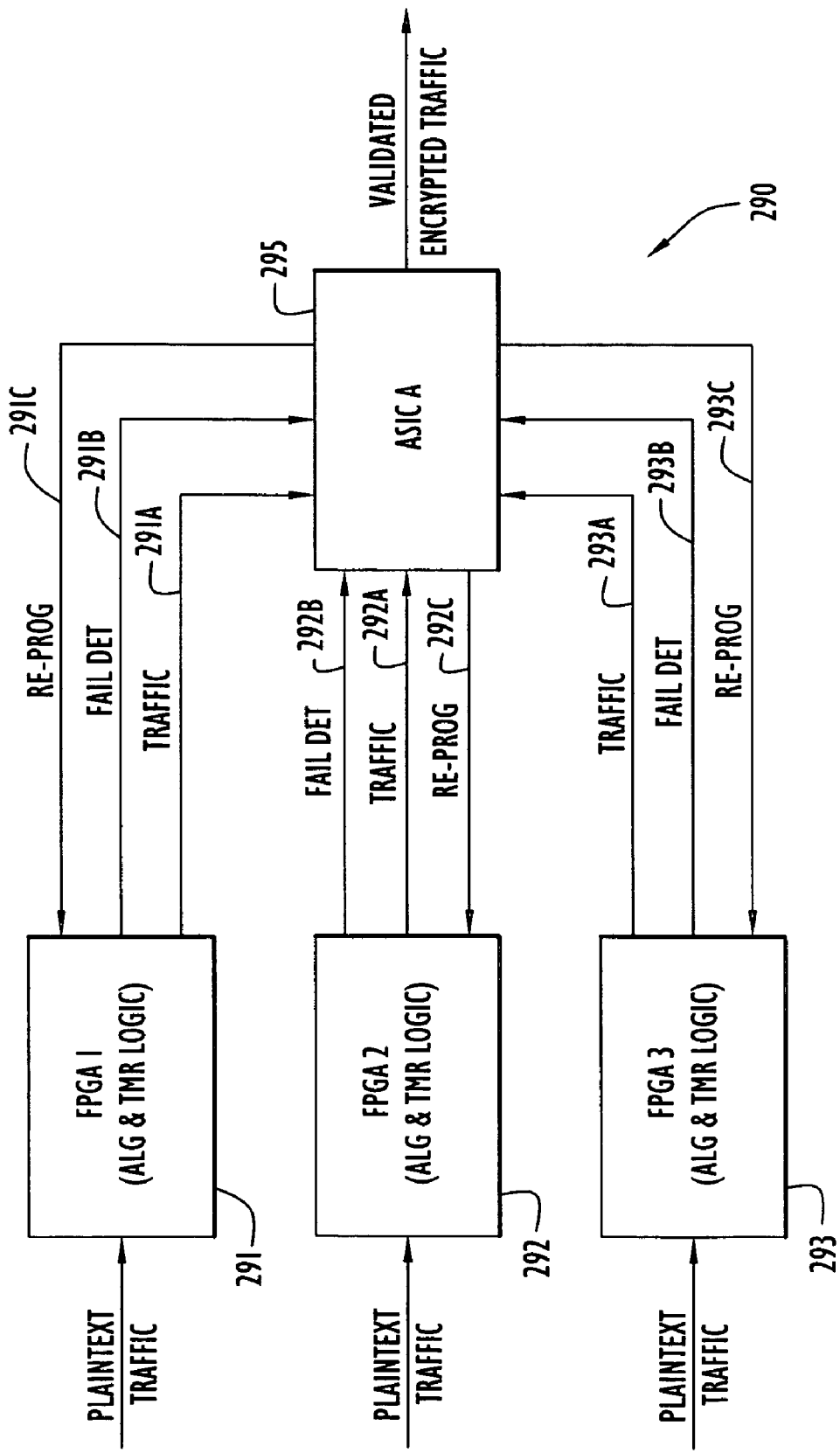
FIG. 2 illustrates a mitigation technique for FPGA upsets in a COMSEC module.

Referring to FIG. 2, a mitigation technique to counter the effects of errors in the programmable components of a COMSEC module is formed integral to the cryptographic engine of the COMSEC module. For example, the architecture of FIG. 2 can replace cryptographic engine A 190A of FIG. 1. Architecture 290 includes programmable logic components, i.e., in this example, three (3) FPGAs, 291, 292, 293, and a fixed logic component, i.e., an ASIC, 295. In this exemplary diagram, plaintext traffic, i.e., "red" data, is input to each of the FPGAs 291, 292, 293. The red data, for instance, may be received from red addr decode & mailbox 125 in FIG. 1. The input plaintext traffic is redundantly received by the three FPGAs 291, 292, 293.

Each FPGA 291, 292, 293 includes a cryptographic algorithm (not shown) and triple mode redundancy (TMR) logic (not shown). Each FPGA 291, 292, 293 redundantly implements the cryptographic algorithm on the received "red" data. The results of the redundant implementation of the algorithm are provided to the TMR logic of each FPGA 291, 292, 293. Then, the TMR logic of each FPGA 291, 292, 293 is applied to the internally redundant results of the each of the FPGAs 291, 292, 293. Through a majority voting scheme, the TMR logic of each FPGA 291, 292, 293 determines a respective encrypted output, labeled TRAFFIC 291A, 292A, 293A in FIG. 2. The encrypted output 291A, 292A, 293A of each FPGA 291, 292, 293, respectively, is transferred to the fixed logic component, i.e., ASIC A 295, from each of the FPGAs 291, 292, 293. The ASIC A 295 then applies its TMR logic to the three results 291A, 292A, 293A received from the FPGAs 291, 292, 293. ASIC A 295 is "rad hard," (radiation hardened) meaning it is designed to be radiation resistant. After examining the three results 291A, 292A, 293A received from the FPGAs 291, 292, 293, respectively, ASIC A 295 determines which is the correct result through majority voting and transmits the validated encrypted output. Thus, the validated encrypted output is the result of applying multi-tier TMR to an input, i.e., applying a second level of TMR to outputs of a first level of TMR.

If any of the FPGAs detect an upset, i.e., a failure, then that status, labeled FAIL Det 291B, 292B, 293B, is transferred to the ASIC A 295 along with an output from the FPGA. The upset is then detected by logic in ASIC A 295. ASIC A 295 includes a state machine, which can initiate a re-programming function for the FPGA that was upset, see Re-Prog 291C, 292C, 293C. The upset FPGA can be taken off-line, re-programmed, and the re-programming tested. Then, the formerly upset FPGA can be brought back on-line with the other FPGAs.

While the above example describes the process of the mitigation technique in which the input is "red" or plaintext traffic, this is not meant to limit the scope of the present invention or to suggest that the architecture can only handle "red" traffic. Rather, as seen in FIG. 1, there is a "red" and a "black" side to the COMSEC module and data traffic flows to and from each side of the COMSEC module. Accordingly, the input could be "black" or encrypted traffic that is decrypted by the cryptographic algorithm with the resulting validated output being a validated unencrypted output.

Additionally, as seen in FIG. 1, the COMSEC module may include more than one crypto engine, e.g., cryptographic engine A and cryptographic engine B 190A, 190B. Multiple copies of the architecture of the mitigation technique described above may be included in a COMSEC module.

Further, while the example of the mitigation technique to be integrated into the COMSEC module has three (3) FPGAs, the number of FPGAs can be extended to n FPGAs. A currently preferred number of FPGAs is four (4). With four redundant FPGAs, it is still possible to implement a TMR strategy when one of the FPGAs is offline, as there will still be three (3) online FPGAs.

Moreover, further refinements of the design of the mitigation technique are possible. For instance, depending upon the actual orbit of the space vehicle, orbit specific calculations are necessary to determine the upset rate and desired operational redundancy. However, the overall concept of redundancy and majority voting remain the same.

While the reprogrammable COMSEC module has been described and represented as an architecture, the reprogrammable COMSEC module may be implemented solely as software as well as a combination of both software and hardware, or even as hardware alone. The above description is not meant to limit the reprogrammable COMSEC module to a particular design, as many variations are possible and within the scope of the description provided thus far.

The present invention may include any quantity of conventional or other transmitters, receivers and/or transceivers, where each transmitter or transceiver may transmit signals at any suitable frequency and in any suitable energy form (e.g., radio signals, microwave, optical signals, etc.), and any quantity of conventional or other receivers or transceivers, where each receiver or transceiver may receive signals at any suitable frequency and in any suitable energy form (e.g., radio signals, microwave, optical signals, etc.). The present invention may include any quantity of independent transmitting and/or receiving devices, may utilize any quantity of frequency channels of any desired frequencies and may send voice and/or data. The present invention may employ any conventional access scheme or protocol to initially access and/or transmit information. The present invention may be in the form of any type of radio unit or other communications device.

The reprogrammable COMSEC module of the present invention may be implemented by any conventional or other microprocessor, controller or circuitry to perform the functions described herein, while any quantity of processors or processing devices or circuitry may be employed within the present invention where the processor functions may be distributed in any fashion among any quantity of hardware and/or software modules, processors or other processing devices or circuits. The software of the present invention may be implemented in any suitable computer language, and could be developed by one of ordinary skill in the computer and/or programming arts based on the functional description contained herein and illustrated in the drawings. Further, any references herein of software performing various functions generally refer to processors performing those functions under software control. The software and/or algorithms described above and illustrated may be modified in any manner that accomplishes the functions described herein.

The communications received or transmitted may be of any size, may have any format, and may contain any desired information. The communications may be transmitted at any suitable transmission rate or have any desired interval between transmissions. The various communications may include any identifier to identify the type of message. The communications may be broadcasted or transmitted any quantity of times.

It is to be understood that the present invention is not limited to the applications or designs described herein, but may be utilized for various secure communications applications.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

The invention claimed is:

1. A method of mitigating logic upsets, comprising:
   providing an input to each of a plurality of programmable logic components;
   processing the input in each of the plurality of programmable logic components;
   providing an output from each of the plurality of programmable logic components to a fixed logic component;
   examining, in the fixed logic component, the outputs from the plurality of programmable logic components;
   determining, in the fixed logic component, a validated output from among the outputs from the plurality of programmable logic components;
   transferring from at least one of the programmable logic components a fail detect signal along with the output from the at least one of the programmable logic components;
   detecting at the fixed logic component, using the fail detect signal, that the at least one of the plurality of programmable logic components has failed; and
   initiating, from the fixed logic component, a re-programming function for the at least one of the plurality of programmable logic components that has failed.

2. The method of claim 1, wherein the plurality of programmable logic components is N programmable logic components, N being an integer number greater than 2.

3. The method of claim 2, wherein N equals 3.

4. The method of claim 2, wherein N equals 4.

5. The method of claim 2, wherein the input comprises N copies of the input and each of the N copies of the input is provided to each of the N programmable logic components, respectively.

6. The method of claim 1, wherein the input is plaintext data.

7. The method of claim 1, wherein each of the programmable logic components is a field programmable gate array (FPGA).

8. The method of claim 1, wherein each of the programmable logic components is radiation tolerant.

9. The method of claim 1, wherein each of the plurality of programmable logic components includes an encryption algorithm and a majority voting logic.

10. The method of claim 9, wherein each of the plurality of programmable logic components processes the input redundantly through the encryption algorithm to obtain redundant results.

11. The method of claim 10, wherein each of the plurality of programmable logic components processes the redundant results through the majority voting logic to determine the output of each of the plurality of programmable logic components, respectively.

12. The method of claim 9, wherein the majority voting logic is triple mode redundancy (TMR) logic.

13. The method of claim 9, wherein each of the plurality of programmable logic components includes the same encryption algorithm.

14. The method of claim 9, wherein each of the plurality of programmable logic components receives the same input.

15. The method of claim 1, wherein the fixed logic component is an application specific integrated circuit (ASIC).

16. The method of claim 1, wherein the fixed logic component is radiation resistant.

17. The method of claim 1, wherein the fixed logic component includes majority voting logic.

18. The method of claim 17, wherein the majority voting logic is triple mode redundancy (TMR) logic.

19. The method of claim 17, wherein the fixed logic component processes the outputs of each of the plurality of programmable logic components to determine the validated output.

20. An architecture for mitigating logic upsets, comprising:
   a traffic input;
   a plurality of programmable logic components, the traffic input being provided to each of the plurality of programmable logic components, each of the programmable logic components including an encryption algorithm and a first majority voting logic, each of the plurality of programmable logic components processing the respective traffic input to determine a respective traffic output from each of the plurality of programmable logic components, each of the plurality of programmable logic components also including a fail detect signal output; and a fixed logic component, the fixed logic component receiving each respective traffic output from each of the plurality of programmable logic components along with the fail detect signal output from each of the plurality of programmable logic components, the fixed logic component including a second majority voting logic, the fixed logic component examining the traffic outputs from the plurality of programmable logic components and determining a validated output, wherein the fixed logic component detects that one of the plurality of programmable logic components has failed based on the fail detect signal output from one of the plurality of programmable logic components and initiates a re-programming function for the one of the plurality of programmable logic components that has failed.

21. The architecture for mitigating logic upsets of claim 20, wherein the plurality of programmable logic components is N programmable logic components, N being an integer number greater than 2.

22. The architecture for mitigating logic upsets of claim 21, wherein N equals 3.

23. The architecture for mitigating logic upsets of claim 21, wherein N equals 4.

24. The architecture for mitigating logic upsets of claim 21, wherein the traffic input comprises N copies of the traffic input and each of the N copies of the traffic input is provided to each of the N programmable logic components, respectively.

25. The architecture for mitigating logic upsets of claim 20, wherein each of the plurality of programmable logic components processes the traffic input redundantly through the encryption algorithm to obtain redundant results.

26. The architecture for mitigating logic upsets of claim 20, wherein each of the plurality of programmable logic components processes the redundant results through the first majority voting logic to determine the traffic output of each of the plurality of programmable logic components, respectively.

27. The architecture for mitigating logic upsets of claim 20, wherein the traffic input is plaintext data.

28. The architecture for mitigating logic upsets of claim 20, wherein each of the plurality of programmable logic components includes the same encryption algorithm.

29. The architecture for mitigating logic upsets of claim 20, wherein each of the plurality of programmable logic components receives the same traffic input.

30. The architecture for mitigating logic upsets of claim 20, wherein the first majority voting logic is triple mode redundancy (TMR) logic.

31. The architecture for mitigating logic upsets of claim 20, wherein each of the programmable logic components is a field programmable gate array (FPGA).

32. The architecture for mitigating logic upsets of claim 20, wherein each of the programmable logic components is radiation tolerant.

33. The architecture for mitigating logic upsets of claim 20, wherein the fixed logic component is an application specific integrated circuit (ASIC).

34. The architecture for mitigating logic upsets of claim 20, wherein the fixed logic component is radiation resistant.

35. The architecture for mitigating logic upsets of claim 20, wherein the second majority voting logic is triple mode redundancy (TMR) logic.

36. The architecture for mitigating logic upsets of claim 20, wherein the fixed logic component processes the traffic outputs of each of the plurality of programmable logic components to determine the validated output.

* * * * *